United States Patent
Yamanaka

(10) Patent No.: US 7,528,479 B2
(45) Date of Patent: May 5, 2009

(54) MULTILAYER SUBSTRATE FOR DIGITAL TUNER AND MULTILAYER SUBSTRATE

(75) Inventor: Yasuhisa Yamanaka, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 235 days.

(21) Appl. No.: 11/516,005

(22) Filed: Sep. 5, 2006

(65) Prior Publication Data

US 2007/0069325 A1    Mar. 29, 2007

(30) Foreign Application Priority Data

Sep. 26, 2005   (JP) .............................. 2005-278792

(51) Int. Cl.
*H01L 23/48*   (2006.01)
*H01L 23/52*   (2006.01)

(52) U.S. Cl. ............... 257/700; 257/758; 257/E23.062; 257/E23.175

(58) Field of Classification Search .................. 257/700, 257/E23.175
See application file for complete search history.

(56) References Cited

U.S. PATENT DOCUMENTS 6,573,600 B2 *   6/2003   Kikuchi et al. .............. 257/750

6,998,654 B2 *   2/2006   Itoh et al. .................... 257/211

FOREIGN PATENT DOCUMENTS

JP    2002-158452    5/2002
JP    2004-281768    10/2004

* cited by examiner

*Primary Examiner*—Lex Malsawma
(74) *Attorney, Agent, or Firm*—Yokol & Co. U.S.A, Inc.

(57) ABSTRACT

Mounting components such as LSIs, which emit noise to the outside and are subjected to the influence of external noise, on the top-most layer and the bottom-most layer respectively, a co-existing layer of the ground region and the power source region has been employed, where a ground region has been provided respectively to the range corresponding to the position the LSIs on the next layer below the top-most layer and the next layer above the bottom-most layer. Accordingly, the number of layers to be laminated to form the multilayer substrate has been reduced, because it is no longer required, unlike the related art, to provide a ground layer where the ground pattern is formed substantially over the entire surface of layer respectively to the next layer below the top-most layer having mounted a LSI thereon and of the next layer above the bottom-most layer having mounting a LSI thereon.

7 Claims, 5 Drawing Sheets

MULTILAYER SUBSTRATE FOR DIGITAL TUNER AND MULTILAYER SUBSTRATE

CROSS-REFERENCE TO THE APPLICATION

The present application is related to the Japanese Patent Application No. 2005-278792, filed Sep. 26, 2005, the entire disclosure of which is expressly incorporated by reference herein.

BACKGROUND OF THE INVENTION (1) Filed of the Invention

The present invention relates to a multilayer substrate for a digital tuner and a multilayer substrate.

(2) Description of Related Art

Plural integrated circuits such as LSI-IC or the like have been mounted on a multilayer substrate. In this case, plural integrated circuits (for example, two circuits) are not mounted on the same layer but may be separately mounted on the upper-most layer (top-most layer) and on the lowest layer (bottom-most layer). The reason is that an integrated circuit is considered as a noise source. In order to avoid influence of noise, these circuits are not mounted on the same layer but on the top-most layer and the bottom-most layer for separation in distance. Moreover, on the inner sides of the top-most and bottom-most layers where the integrated circuits are mounted, a ground layer has respectively been formed, where a pattern for ground has been formed flat over its entire surface. That is, the ground layer can effectively prevent influence of noise from mutually effecting each integrated circuit respectively generated by each of the integral circuits, by introducing the structure explained above in order to fully show the effect for shielding noise.

Moreover, a structure of the multilayer substrate including in parallel a power source pattern region and a ground pattern region has also been proposed (for example, refer to JP-A 2004-281768 and JP-A 2002-158452).

In the multilayer substrate, it is also necessary to acquire a power source layer where a pattern for power source supply is arranged, in addition to a layer for mounting electronic components and the ground layer. Therefore, the above mentioned structure where the inner layers of the integrated circuit-mounted top-most layer and the bottom-most layer are assigned as ground layers allows increase in the number of layers to be laminated as the substrate. As a result, the structure explained above has been accompanied by a problem that the substrate manufacturing cost becomes higher.

Meanwhile, when a substrate with less number of layers to be laminated is employed for cost reduction purposes, there is no allowance for respective assigning of the inner layers of the integrated circuit-mounted top-most layer and the bottom-most layer as the ground layers, resulting in such a disadvantage that it is difficult to provide sufficient measures for noises.

Moreover, the reference documents explained above, JP-A 2004-281768 and JP-A 2002-158452 do not disclose the techniques for respectively mounting integrated circuits on the top-most and bottom-most layers among the layers forming a multilayer substrate. In addition, these patent documents disclose the techniques to provide a ground layer with only the pattern for ground formed over its entire surface. The number of layers of substrate increases to acquire such a ground layer and thereby manufacturing cost increases markedly. Moreover, since a couple of LSIs are mounted on the same layer in the reference document 1, no measure is taken for influence of noises to which both LSIs are subjected.

BRIEF SUMMARY OF THE INVENTION

The present invention has been proposed in view of addressing the problem explained above. It is therefore an advantage according to the invention to provide a multilayer substrate for a digital tuner and a multilayer substrate for lowering the manufacturing cost of the substrate by reducing the number of layers of the multilayer substrate to the minimum and also for positively shielding noises for electronic components which should not be subjected to influence of noises.

In view of achieving the advantage explained above, one aspect of the present invention provides a multilayer substrate that comprises a layer including a power source pattern region having a power source pattern and a ground pattern region having a ground pattern, both region being formed on the same surface of the layer, and that is configured so as not to include a layer having only the ground pattern region formed over substantially its entire surface by including: a first component layer having mounted a first integrated circuit on the surface thereof; a first co-existing layer that is a layer below the first component layer, having formed on the surface thereof a first ground pattern region and a first power source pattern region; a second co-existing layer that is a layer below the first co-existing layer, having formed on the surface thereof a second ground pattern region and a second power source pattern region; and a second component layer that is a layer below the second co-existing layer, having formed on the surface thereof a second integrated circuit, wherein: the first ground pattern region is formed in the range corresponding to the region in the first component layer including the mounting positions of the first integrated circuit and the periphery thereof; the second power source pattern region is formed in the range corresponding to the relevant first ground pattern region; the second ground pattern region is formed in the range corresponding to the region in the second component layer including the mounting positions of the second integrated circuit and the periphery thereof; and the first power source pattern region is formed in the range corresponding to the relevant second ground pattern region.

According to an aspect of the present invention constituted as explained above, the ground pattern region and the power source pattern region are co-provided respectively in the first co-existing layer and the second co-existing layer. The first integrated circuit is mounted on the surface of the first component layer, the first ground pattern region is formed in the region therebelow corresponding to the region in the first component layer including the mounting positions of the first integrated circuit and the periphery thereof, and the second power source pattern region is formed in the region therebelow corresponding to the first ground pattern region. Moreover, the second integrated circuit is mounted on the surface of the second component layer, the second ground pattern region is formed in the region above the region in the second component layer including the mounting positions of the second integrated circuit and the periphery thereof, and the first power source pattern region is formed in the region above the second ground pattern region.

As a result, the first ground pattern region of the first co-existing layer works as a shielding member for shielding noise for the first integrated circuit, while the second ground pattern region of the second co-existing layer works as a shielding member for shielding noise for the second integrated circuit. Moreover, the first integrated circuit and the second integrated circuit can be protected from noise without provision of the layer where only the ground pattern region is formed over substantially its entire surface.

According to one optional aspect of the present invention provides the multilayer substrate, wherein the first power source pattern region and the second power source pattern region are respectively formed by line patterns of the predetermined width by laying down the patterns in the regions, and the patterns in the power source pattern regions are connected with the corresponding component layers through the interlayer connecting holes of the predetermined number.

In the first power source pattern region and the second power source pattern region, the line patterns of the predetermined width are formed. When the patterns in such power source pattern regions are connected with the component layers for mounting electronic components such as the integrated circuits through the predetermined number of interlayer connecting holes, a predetermined impedance is generated on the path connecting the power source pattern regions and component layers. Thereby, the noise appearing on the same path from the power source pattern regions can be reduced.

Another optional aspect of the present invention provides the multilayer substrate, wherein the first ground pattern region and second ground pattern region respectively have patterns formed over substantially the entire surface of the regions, and the patterns in the ground pattern regions are connected with the corresponding component layers with a larger number of the interlayer connecting holes than that for connecting the power source pattern regions and the component layers.

That is, unlike the power source pattern regions, patterns are formed flat in the ground pattern region and the ground pattern region and the component layer are connected by a larger number of the interlayer connecting holes than the interlayer connecting holes for connecting the power source pattern regions and the component layers. As a result, impedance generated between the ground pattern region and the component layer can be reduced remarkably.

Another optional aspect of the present invention provides the multilayer substrate, wherein the first power source pattern region is connected with the second component layer via the interlayer connecting holes and the second power source pattern region is connected with the first component layer via the interlayer connecting holes. Another optional aspect of the present invention provides the multilayer substrate, wherein the first ground pattern region is connected with the first component layer via the interlayer connecting holes and the second ground pattern region is connected with the second component layer via the interlayer connecting holes, it is also possible to employ the constitution that the first power source pattern region is connected with the second component layer via the interlayer connecting holes and the second power source pattern region is connected with the first component layer via the interlayer connecting holes.

That is, the first component layer having the first integrated circuit mounted thereon is connected respectively with the first ground pattern region and the second power source pattern region laminated therebelow, while the second component layer having the second integrated circuit mounted thereon is connected respectively with the second ground pattern region and the first power source pattern region laminated thereabove. As a result, impedance generated between the first component layer and the ground and impedance generated between the first component layer and the power source are substantially unified. Moreover, impedance between the second component layer and the ground and impedance between the second component layer and the power source are substantially unified.

Another optional aspect of the present invention provides the multilayer substrate, wherein the first power source pattern region and the second power source pattern region respectively have formed thereon a plurality of small pattern regions for supplying power sources of a plurality of kinds of voltage levels.

That is, since it is required to supply the power source voltages of plural kinds of voltage levels in order to operate integrated circuits and the other electronic components mounted on the component layer, the first power source pattern region and the second power source pattern region have formed respectively small pattern regions to supply the power source voltage of the predetermined voltage level to the component layer from each small pattern region.

On the basis of the constitutions explained above, another aspect of the present invention provides a multilayer substrate for a digital tuner that comprises a layer including a power source pattern region having a power source pattern and a ground pattern region having a ground pattern, both region being formed on the same surface of the layer, and that is configured so as not to include a layer having only the ground pattern region formed over substantially its entire surface by including: a first component layer that has mounted thereon a first LSI-IC and predetermined electronic components on one of the right and left sides of the layer surface with respect to the approximate center of the substrate surface; a first co-existing layer that is a layer below the first component layer, having formed thereon a first ground pattern region and a first power source pattern region on the same surface thereof; a second co-existing layer that is a layer below the first co-existing layer, having formed thereon a second ground pattern region and a second power source pattern region on the same surface thereof; and a second component layer that is a layer below the second co-existing layer, having mounted thereon a second LSI-IC and predetermined electronic components on the other side of the right and left sides of the layer surface with respect to the approximate center of the substrate surface, wherein: the first ground pattern region is formed in a range corresponding to the region of the first component layer including the mounting positions of the first LSI-IC, the predetermined electronic components, and the periphery thereof; the second power source pattern region is formed in a range corresponding to the relevant first ground pattern region; the second ground pattern region is formed in the range corresponding to the region of the second component layer including the mounting positions of the second LSI-IC, the predetermined electronic components, and the periphery thereof; and the first power source pattern region is formed in the range corresponding to the relevant second ground pattern region, wherein: the first power source pattern region and the second power source pattern are respectively formed by laying down line patterns of a predetermined width in the regions; the first power source pattern region connects the patterns and the second component layer via a predetermined number of vias; and the second power source pattern region connects the patterns and the first component layer via a predetermined number of vias, wherein: the first ground pattern region and the second ground pattern region are respectively provided with patterns formed over substantially the entire surface of the regions; the first ground pattern is connected with the first component layer by a larger number of vias than the number of vias for connecting the second power source pattern region and the first component layer; the second ground pattern is connected with the second component layer by a larger number of vias than the number of vias for connecting the first power source pattern region and the second component layer, and wherein the first power source pattern region and the second power source pattern region have respectively formed therein a plurality small pattern regions for supplying power sources of a plurality of kinds of voltage levels.

It is a matter of course that the operations and effects similar to that in the other aspects can be attained even in the multilayer substrate to be mounted on a practical product such as a digital tuner as explained above.

According to an aspect of the present invention, as explained above, the first co-existing layer allowing co-existing of the first ground pattern region and the first power source pattern region and the second co-existing layer allowing co-existing of the second ground pattern and the second power source pattern are provided in the manner that the first ground pattern region and the second power source pattern region are laminated in this sequence downward from the first component layer at the position corresponding to the mounting position of the first integrated circuit and the second ground pattern region and the first power source pattern region are laminated in this sequence upward from the second component layer at the position corresponding to the mounting position of second integrated circuit. Therefore, the first ground pattern shows excellent shielding effect for the first integrated circuit, while the second ground pattern shows excellent shielding effect for the second integrated circuit. As a result, a couple of integrated circuits can be prevented from being subjected to the influence of noises respectively generated from the other integrated circuit.

Moreover, since it is not required to provide one layer in order to provide the ground layer where only the ground pattern is formed at the inner side of the component layer, the number of layers of the substrate can be reduced, thereby reducing the manufacturing cost of the substrate.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Figure 1:
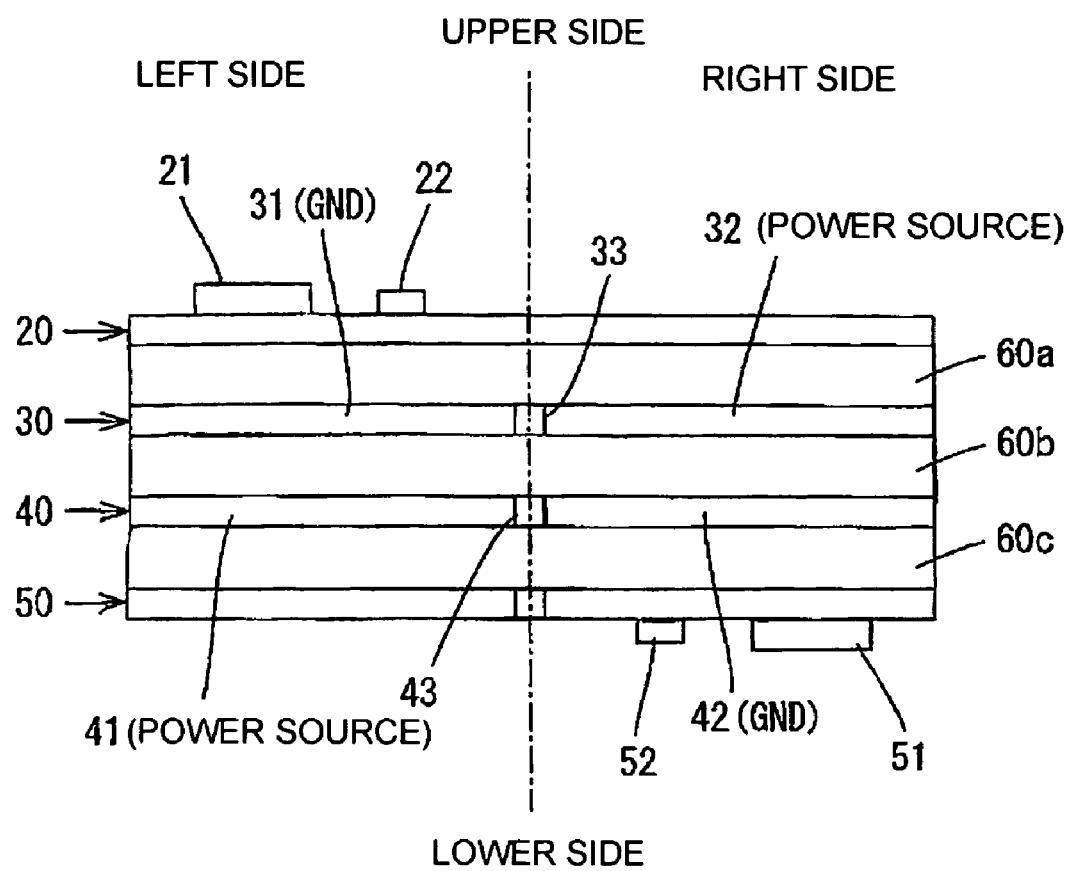
FIG. 1 is an exemplary illustration of a side view of a structure of a multilayer substrate.

FIG. 1 schematically illustrates a structure of laminated layers of a multilayer substrate 10 as a preferred embodiment of the present invention.

In this embodiment, the multilayer 10 is formed as a four-layer substrate, comprising, from the upper layers, a component layer 20 (first component layer), a ground pattern/power source pattern co-existing layer (first co-existing layer) 30, a ground pattern/power source pattern co-existing layer (second co-existing layer) 40, and a component layer (second component layer) 50. Moreover, insulating layers 60a, 60b, 60c of the predetermined thickness are respectively provided between the component layer 20 and the first co-existing layer 30, between the first co-existing layer 30 and the second co-existing layer 40, and between the second co-existing layer 40 and the component layer 50.

In this embodiment, a couple of LSI-ICs (hereinafter, referred to only as LSIs) 21, 51 are mounted on the multilayer substrate 10. More concretely, one LSI is respectively mounted on the component layer 20 as the upper-most (top-most) layer of the multilayer substrate 10 and to the component layer 50 as the lowest (bottom-most) layer of the substrate. Since a constant distance can be kept between the LSIs 21 and 51 that are considered respectively as noise sources, by mounting the LSIs 21 and 51 to the top-most and bottom-most layers of the multilayer substrate, without mounting them on the same layer, mutual influence of noise on the LSIs can be controlled to a certain degree.

Moreover, the mounting positions of LSI on the component layers 20 and 50 cannot be selected freely. One LSI is mounted on either of the right and left sides with respect to the approximate center of the substrate surface, while the other LSI is mounted on the other side of the right and left sides. In FIG. 1, the LSI 21 and the predetermined electronic component 22 (for example, another IC) that are components to be protected from external noise are mounted at the position on the surface of the component layer 20, namely on the left side position with respect to the approximate center line (a chain line) of the substrate surface. Moreover, the LSI 51 and the predetermined electronic component 52 (for example, the other IC) that are components to be protected from external noise are mounted on the position on the component surface 50, namely to the right side position for the approximate center line explained above.

Figure 2:
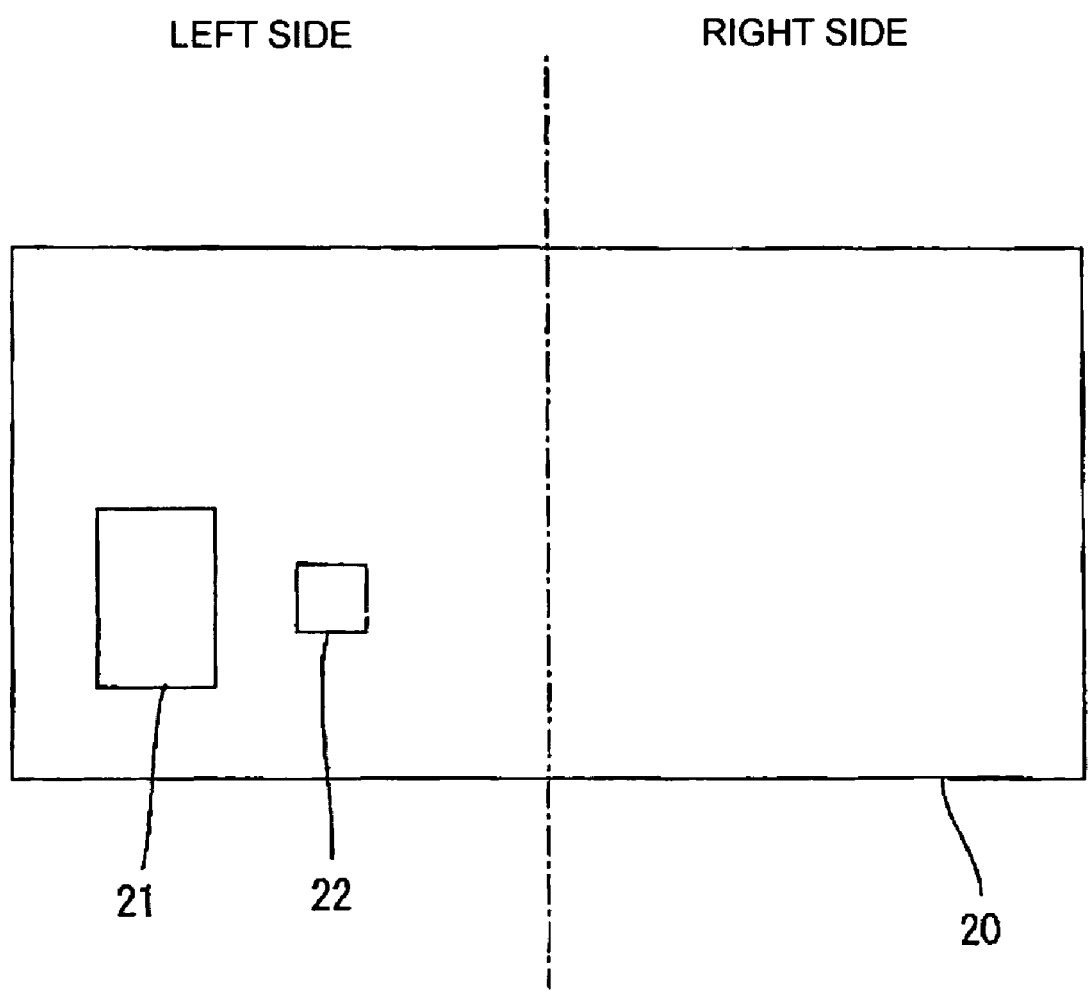
FIG. 2 is an exemplary illustration of a plan view of a component layer as the top-most layer.

FIG. 2 is a plan view of the component layer 20. It can also be understood, from FIG. 2, that the LSI 21 and the electronic component 22 are located at the left side with respect to the approximate center line of the substrate surface.

Figure 3:
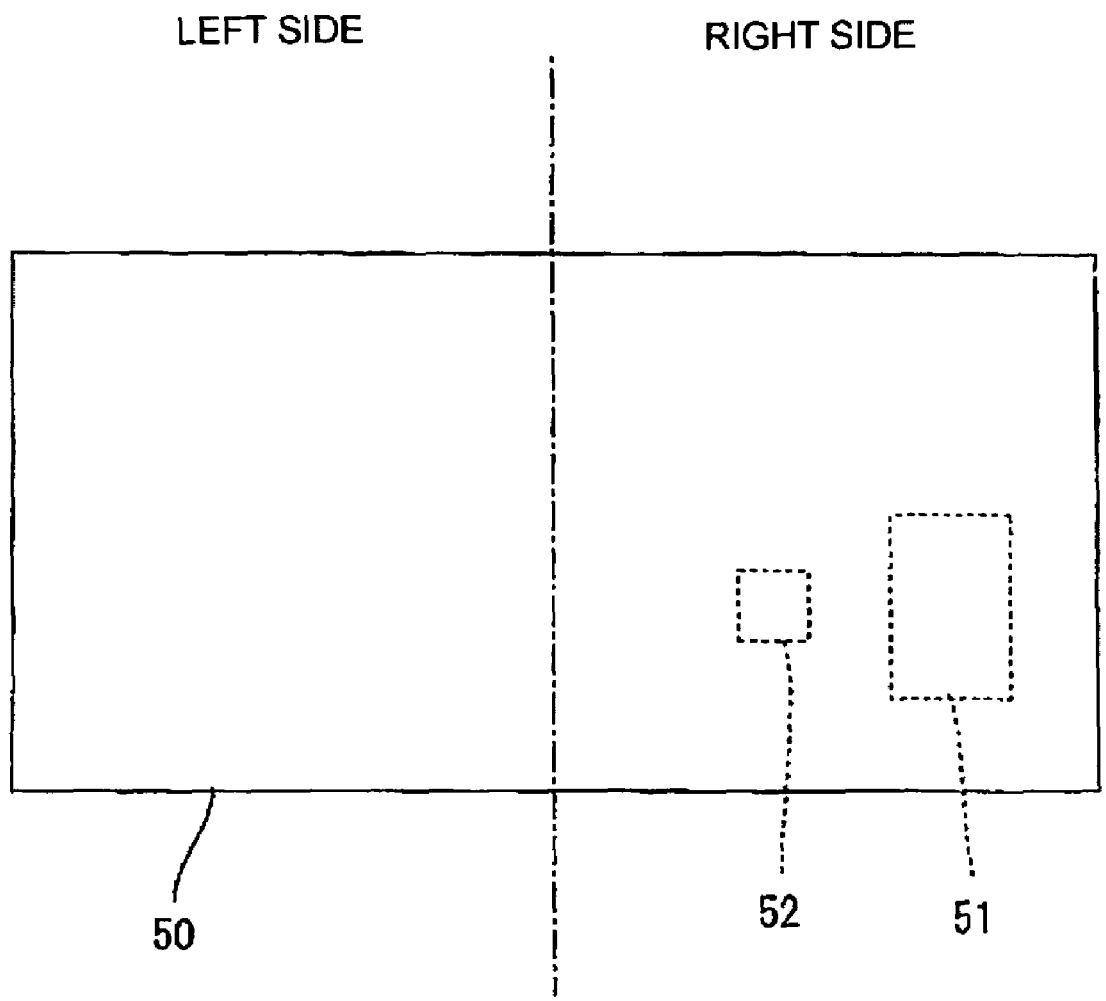
FIG. 3 is an exemplary illustration of a plan view of a component layer as the bottom-most layer.

Similarly, FIG. 3 is a plan view of the component layer 50. It can also be understood, from FIG. 3, that the LSI 51 (indicated by a chain line) and the electronic component 52 (indicated by a chain line) are located at the right side with respect to the approximate center line of the substrate surface.

Next, the first co-existing layer 30 and the second co-existing layer 40 will be explained.

The first co-existing layer 30 is roughly constituted by a ground region 31 and a power source region 32. The second co-existing layer 40 is roughly constituted by a ground region 42 and a power source region 41. The ground regions 31 and 42 are regions where the ground patterns are formed flat over substantially the entire surface of respective regions. Meanwhile, the power source region 32 and the power source region 41 are regions that have been formed by laying down of the line patterns of the predetermined width on the respective regions.

Figure 4:
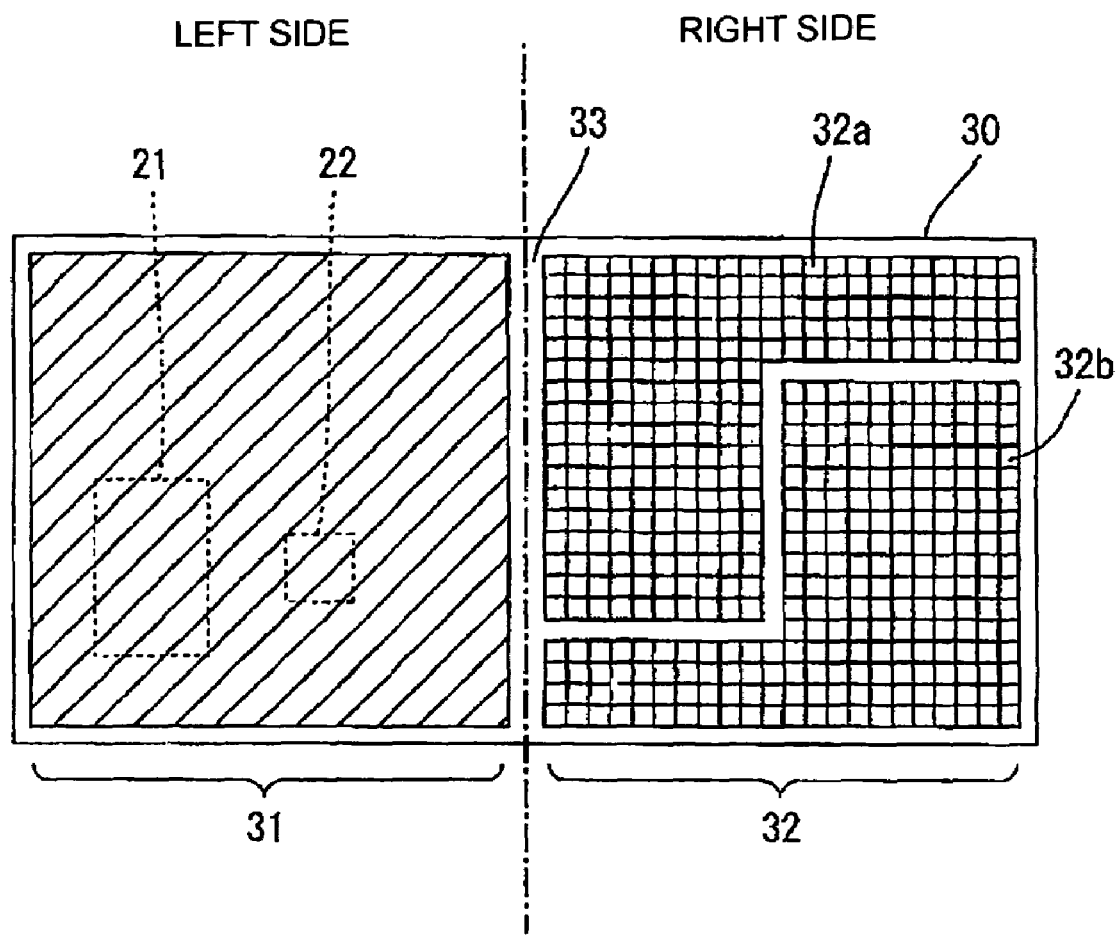
FIG. 4 is an exemplary illustration of a plan view of a first co-existing layer.
Figure 5:
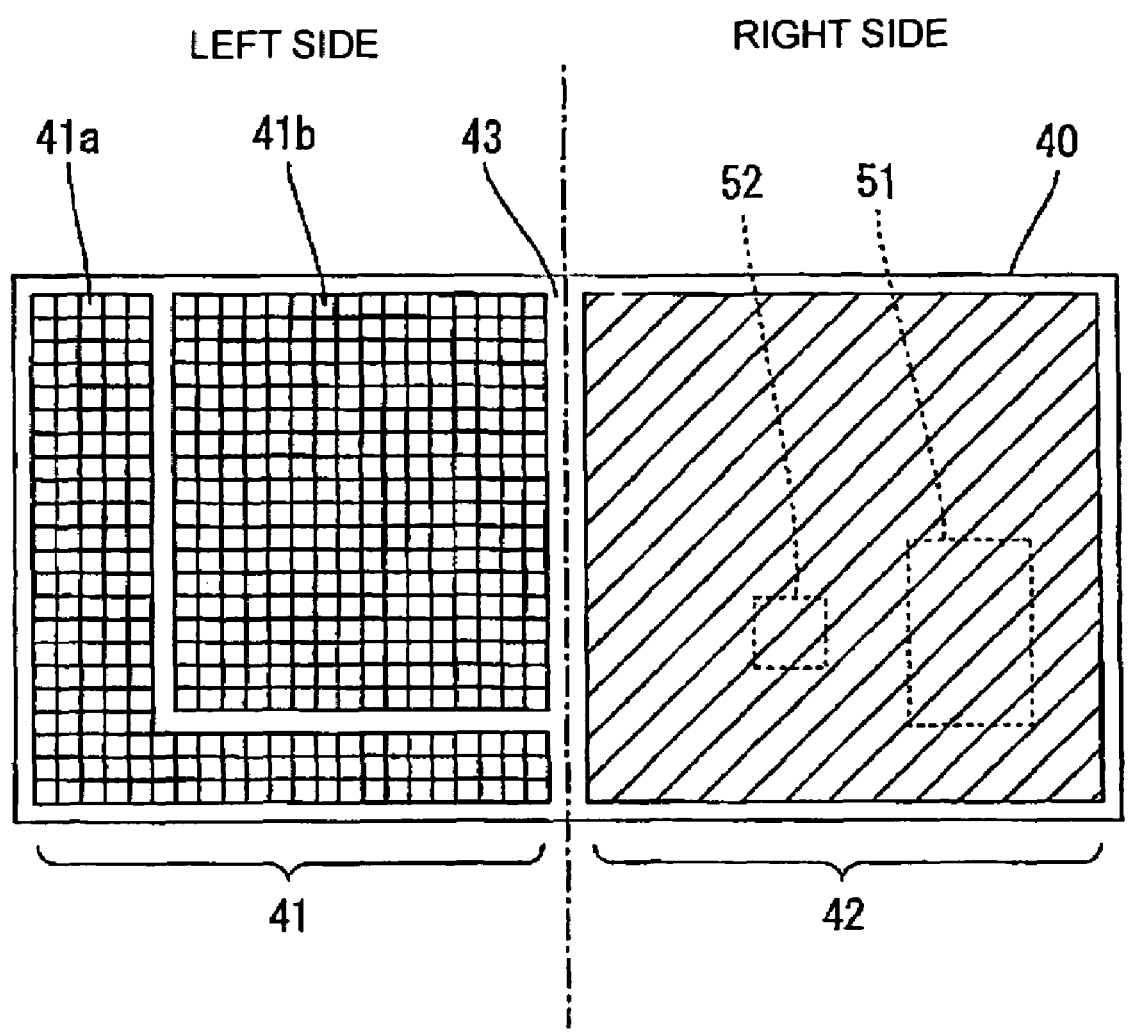
FIG. 5 is an exemplary illustration of a plan view of a second co-existing layer.

FIG. 4 is a plan view of the first co-existing layer 30, while FIG. 5 is a plan view of the second co-existing layer 40. In each figure, the flat type ground pattern is expressed as the hatched region conveniently and the wired line pattern in the predetermined width is expressed as the meshed region.

In the first co-existing layer 30, the ground region 31 is formed on the left side of the approximate center line of the substrate surface, while the power source region 32 is formed in the right side thereof. Here, the boundary of the ground region 31 and the power source region 32 is not required to be laid strictly along the approximate center line, but at least the ground region 31 is formed in the range including the position where the LSI 21 and the electronic component 22 are mounted when the multilayer substrate 10 is viewed from above. In the same figure, the mounting position of the LSI 21 and the electronic component 22 on the component layer 20 are indicated with the chain lines. Moreover, a patternless region 33 where no pattern is formed is provided between the ground region 31 and the power source region 32, and the ground region 31 is thereby insulated from the power source region 32.

In the second co-existing layer 40, the ground region 42 is formed on the right side with respect to the approximate center line of the substrate surface, while the power source region 41 is formed on the left side thereof. The boundary of the ground region 42 and the power source region 41 is not required to be formed strictly along the approximate center line thereof but at least the ground region 42 is formed in the range including the position where the LSI 51 and the electronic component 52 are mounted when the multilayer substrate 10 is viewed from above. In the same figure, the mounting positions of the LSI 51 and the electronic component 52 on the component layer 50 are indicated with the chain lines. A patternless region 43 where no pattern is formed is provided between the ground region 42 and the power source region 41 and thereby the ground region 42 is insulated from the power source region 41.

Namely, in this embodiment, on the occasion of mounting the LSIs 21, 51 and the electronic components 22, 52 on the component layers 20 and 50, these are mounted on positions not bridging over the boundary between the ground region and power source region in the first co-existing layer 30 and the second co-existing layer 40.

Next, interlayer connections will be explained below. In this embodiment, respective layers are electrically connected through the vias (interlayer connecting holes). More concretely, connections will be made as explained below.

A pattern of the ground region 31 of the first co-existing layer 30 is connected, through the vias, to the ground terminals of the LSI 21 and the electronic component 22 mounted on the component layer 20 (or a pattern in the component layer 20 connected with the ground terminals). Moreover, a pattern of the power source region 41 of the second co-existing layer 40 is connected through the vias to the power source terminals of the LSI 21 and the electronic component 22 (or a pattern in the component layer 20 connected with the power source terminals).

Meanwhile, a pattern of the ground region 42 of the second co-existing layer 40 is connected through the vias to the ground terminals of the LSI 51 and the electronic component 52 mounted on the component layer 50 (or a pattern in the component layer 50 connected to the ground terminals). Moreover, a pattern of the power source region 32 of the first co-existing layer 30 is connected through the vias to the power source terminals of the LSI 51 and the electronic component 52 (or a pattern in the component layer 50 connected to these power source terminals).

In this embodiment, the number of vias for connection with the ground region 31 (41) is set larger than that for connection with the power source region 41 (32), and the ground region and the component layer are connected with the maximum number of vias in each component layer 20 (50). As a result, impedance between the ground region and the component layer can be reduced to a large extent. On the other hand, the power source region having formed the line pattern of the predetermined width and the component layer are connected with the vias of the predetermined numbers (less than the number of vias for connecting the ground region and the component layer). As a result, since a certain impedance is generated in the path connecting the power source region and the component layer, noise appearing on the same path from the pattern of power source region can be lowered.

Here, the following effects can be achieved by employing a structure explained above in the multilayer substrate 10.

That is, in the case where components such as LSI that generates noise to the outside and that may also be easily subjected to influence of external noise are mounted respectively on the top-most and the bottom-most layers, the next layer below the top-most layer and the next layer above the bottom-most layer have respectively been formed as the co-existing layers of the ground pattern and the power source pattern including the ground region to the range corresponding to the position of component such as LSI or the like. Therefore, it is no longer required, unlike the related art, to form the ground layers where the ground pattern is respectively formed over substantially the entire surface thereof, on the next layer below the top-most layer where the LSI is formed and the next layer above the bottom-most layer where the LSI is formed. Thereby, the number of layers of the multilayer substrate can be reduced.

More concretely, in the case where the top-most layer and the bottom-most layer are formed as the component layers and the ground pattern and the power source pattern respectively corresponding to the top-most layer and the bottom-most layer are required in addition to such component layers, a six-layer substrate structure has been employed in the related art. However, the four-layer substrate can be achieved according to the structure of the present invention. Accordingly, manufacturing cost of the substrate can surely be lowered.

Moreover, according to the invention, an adequate measure against noise for the components such as LSI can surely be taken, together with reduction in the number of laminated layers of the substrate. Namely, the ground region 31 of the first co-existing layer 30 works as the shielding member for the LSI 21 and electronic component 22 mounted on the component layer 20 and the relevant ground region 31 shields the noise generated from the other LSI 51 or the like and the noise generated from the power source region. In addition, spread of noise generated by the LSI 21 itself into the inner side of the multilayer substrate 10 can be controlled with the ground region 31.

Similarly, the ground region 42 of the second co-existing layer 40 works as the shielding member for the LSI 51 and electronic component 52 mounted on the component layer 50 and the relevant ground region 42 shields the noise generated from the other LSI 21 or the like and the noise generated from the power source region. Moreover, spread of noise generated by the LSI 51 itself into the inner side of the multilayer substrate 10 can be controlled with the ground region 42.

Therefore, the components that should not be subjected to influence of noise such as the LSIs 21, 51 and electronic components 22, 52 can surely be protected from noise.

Moreover, since the ground terminals of the LSI 21 and electronic component 22 are connected with the common ground region 31, impedances between the LSI 21, electronic component 22 and the ground region 31 are substantially unified. Similarly, since the ground terminals of the LSI 51 and electronic component 52 are connected with the common ground region 42, impedances between the LSI 51, electronic component 52 and the ground region 42 are substantially unified. In addition, impedances between the LSI 21, electronic component 22 and the ground region 31 and impedances between the LSI 51, electronic component 52 and the ground region 42 are not unified respectively because thickness and dielectric constant of the insulating layer 60a and insulating layer 60c provided between these elements are different.

Since the power source terminals of the LSI 21 and electronic component 22 are connected with the common power source region 41, impedances between the LSI 21, electronic component 22 and the power source region 41 are substantially unified. Similarly, the power source terminals of the LSI 51 and electronic component 52 are connected with the common power source region 32, impedances between the LSI 51, electronic component 52 and the power source region 32 are substantially unified. Moreover, impedances between the LSI 21, electronic component 22 and the power source region 41 and impedances between the LSI 51, electronic component 52 and the power source region 32 are not unified because thickness and dielectric constant of the insulating layers provided between these elements are different.

Namely, with the impedance characteristics explained above, the LSI 21 and electronic component 22 and the LSI 51 and electronic component 52 can respectively be concluded to become further difficult to generate noise and to be subjected to influence of external noise.

Here, as illustrated in FIG. 4 and FIG. 5, the power source region 32 is divided into small regions 32a and 32b, while the power source region 41 is divided into small regions 41a and 41b. The reason is that each component mounted on the component layers 20 and 50 requires the power source voltages of plural voltage levels. Namely, in the power source region 32, the small regions 32a, 32b are formed respectively as the patterns to supply the power source voltages of different levels. Similarly, in the power source region 41, the small regions 41a, 41b are formed respectively as the patterns to supply the power source voltages of different levels.

The multilayer substrate 10 of the present invention may be mounted on various electronic circuits. As an example, the same multilayer substrate may be mounted on a digital tuner circuit for receiving the digital broadcast signals. In this case, the LSIs 21, 51 mounted on the multilayer substrate 10 are designed as the ICs for executing the process to select the receivable broadcast signal corresponding to the predetermined channel from the digital broadcast signals of each station and the process to extract the intermediate frequency signal from the selected broadcast signal.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

What is claimed is:
1. A multilayer substrate for a digital tuner comprising:
a first component layer;
a first co-existing layer below the first component layer;
a second co-existing layer below the first co-existing layer; and
a second component layer below the second co-existing layer;
the first component layer, the first co-existing layer, the second co-existing layer, and the second component layer have a first area and a second area;
the first area is proximal to one of a left and a right of a center line of the multilayer substrate;
the second area is proximal to another of the left and the right of the center line of the multiplayer substrate;
the first area of the first co-existing layer is positioned under the first area of the first component layer;
the first area of the second co-existing layer is positioned under the first area of the first co-existing layer;
the first area of the second component layer is positioned under the first area of the second co-existing layer;
the second area of the first co-existing layer is positioned under the second area of the first component layer;
the second area of the second co-existing layer is positioned under the second area of the first co-existing layer;
the second area of the second component layer is positioned under the second area of the second co-existing layer;
the first component layer mounts a first LSI-IC and predetermined electronic components on an exterior facing surface of the first area of the first component layer;
the first co-existing layer forms a first ground pattern region having a ground pattern on the first area of the first co-existing layer and forms a first power source pattern region having a power source pattern on the second area of the first co-existing layer;
the second co-existing layer forms a second power source pattern region having a power source pattern on the first area of the second co-existing layer and forms a second ground pattern region having a ground pattern on the second area of the second co-existing layer;
the second component layer mounts a second LSI-IC and predetermined electronic components on an exterior facing surface of the second area of the second component layer;
the first power source pattern region and the second power source pattern region are respectively formed by line patterns of a predetermined width on the second area of the first co-existing layer and the first area of the second co-existing layer;
the line patterns in the first power source pattern region connect with the second component layer via a predetermined number of vias;
the line patters in the second power source pattern region connect with the first component layer via a predetermined number of vias,
the first ground pattern region and the second ground pattern region are respectively provided with patterns formed over substantially the entire surface of the first area of the first co-existing layer and the second area of the second co-existing layer;
the first ground pattern region is connected with the first component layer by a larger number of vias than the number of vias for connecting the second power source pattern region and the first component layer;

the second ground pattern region is connected with the second component layer by a larger number of vias than the number of vias for connecting the first power source pattern region and the second component layer, and the first power source pattern region and the second power source pattern region have respectively formed therein a plurality small pattern regions for supplying power sources of a plurality of kinds of voltage levels.

2. A multilayer substrate comprising:

a first component layer;

a first co-existing layer below the first component layer;

a second co-existing layer below the first co-existing layer; and a second component layer below the second co-existing layer;

the first component layer, the first co-existing layer, the second co-existing layer, and the second component layer have a first area and a second area;

the first area is proximal to one of a left and a right of a center line of the multilayer substrate;

the second area is proximal to another of the left and the right of the center line of the multiplayer substrate;

the first area of the first co-existing layer is positioned under the first area of the first component layer;

the first area of the second co-existing layer is positioned under the first area of the first co-existing layer;

the first area of the second component layer is positioned under the first area of the second co-existing layer;

the second area of the first co-existing layer is positioned under the second area of the first component layer;

the second area of the second co-existing layer is positioned under the second area of the first co-existing layer;

the second area of the second component layer is positioned under the second area of the second co-existing layer;

the first component layer mounts a first integrated circuit on an exterior facing surface of the first area of the first component layer;

the first co-existing layer forms a first ground pattern region having a ground pattern on the first area of the first co-existing layer and forms a first power source pattern region having a power source pattern on the second area of the first co-existing layer;

the second co-existing layer forms a second power source pattern region having a power source pattern on the first area of the second co-existing layer and forms a second ground pattern region having a ground pattern on the second area of the second co-existing layer;

the second component layer mounts a second integrated circuit on an exterior facing surface of the second area of the second component layer.

3. The multilayer substrate according to claim 2, wherein the first power source pattern region and the second power source pattern region are respectively formed by line patterns of a predetermined width on the second area of the first co-existing layer and the first area of the second co-existing layer, the line patterns in the first power source pattern region are connected with the second component layer through interlayer connecting holes of a first predetermined number, and the line patterns in the second power source pattern region are connected with the first component layer through interlayer connecting holes of a second predetermined number.

4. The multilayer substrate according to claim 3, wherein the first ground pattern region and the second ground pattern region respectively have patterns formed over substantially an entire surface of the first area of the first co-existing layer and the second area of the second co-existing layer, the patterns in the first ground pattern region are connected with the first component layer with a larger number of the interlayer connecting holes than that for connecting the second power source pattern region and the first component layer, and the patterns in the second ground pattern region are connected with the second component layers with a larger number of the interlayer connecting holes than that for connecting the first power source pattern region and the second component layer.

5. The multilayer substrate according to claim 2, wherein the first power source pattern region and the second power source pattern region respectively have formed thereon a plurality of small pattern regions for supplying power sources of a plurality of voltage levels.

6. The multilayer substrate according to claim 2, wherein the multilayer substrate is mounted on a digital tuner circuit for receiving digital broadcast signals.

7. The multilayer substrate according to claim 6, wherein the first integrated circuit and the second integrated circuit are ICs for executing a process to select the broadcast signal corresponding to a predetermined channel from the receivable digital broadcast signals of each station, and a process to extract a intermediate frequency signal from the selected broadcast signal.

* * * * *